United States Patent [19]

Soneda et al.

[11] Patent Number: 4,463,383

[45] Date of Patent: Jul. 31, 1984

[54] IMAGE PICKUP APPARATUS

[75] Inventors: Mitsuo Soneda, Zama; Takashi Noguchi, Atsugi; Takaji Ohtsu, Hadano, all of Japan

[73] Assignee: Sony Corporation, Tokyo, Japan

[21] Appl. No.: 375,109

[22] Filed: May 5, 1982

[30] Foreign Application Priority Data

May 9, 1981 [JP] Japan .................. 56-69786

[51] Int. Cl.³ .......................................... H04N 5/197
[52] U.S. Cl. .................................. 358/212; 358/213; 250/209; 330/257
[58] Field of Search ................. 358/209, 212, 213, 59, 358/160, 241; 250/208, 209, 278; 330/257

[56] References Cited

U.S. PATENT DOCUMENTS 3,696,250 10/1972 Weimer .............................. 358/213
4,274,113 6/1981 Ohba .................................. 358/212
4,333,111 6/1982 Noda .................................. 358/213

Primary Examiner—Tommy P. Chin
Attorney, Agent, or Firm—Lewis H. Eslinger; Alvin Sinderbrand

[57] ABSTRACT

Solid-state image pickup apparatus, such as an MOS imager, has a two-dimensional array of picture element units each formed of a photo sensitive element and a gating element, and scanning circuits for supplying horizontal and vertical scanning pulses. The picture unit elements in turn discharge a signal charge onto vertical and horizontal transmitting lines in response to the vertical and horizontal scanning pulses. Then, a resulting signal current is used to develop an output video signal. In order to provide a strong output video signal with a good S/N ratio, a current mirror circuit, formed of an input transistor and an output transistor with first current-carrying electrodes joined together to a voltage reference point and with control electrodes joined together, amplifies the signal current. A second current-carrying electrode of the input transistor receives a constant current from a current source and also receives the signal current. The output transistor has a second current-carrying electrode connected to an output load. Another current source can be connected to the output transistor so that only AC current will flow to the output load. The output load can be a load capacitor associated with a pre-charging transistor, or can be a serial charge transfer device.

24 Claims, 34 Drawing Figures

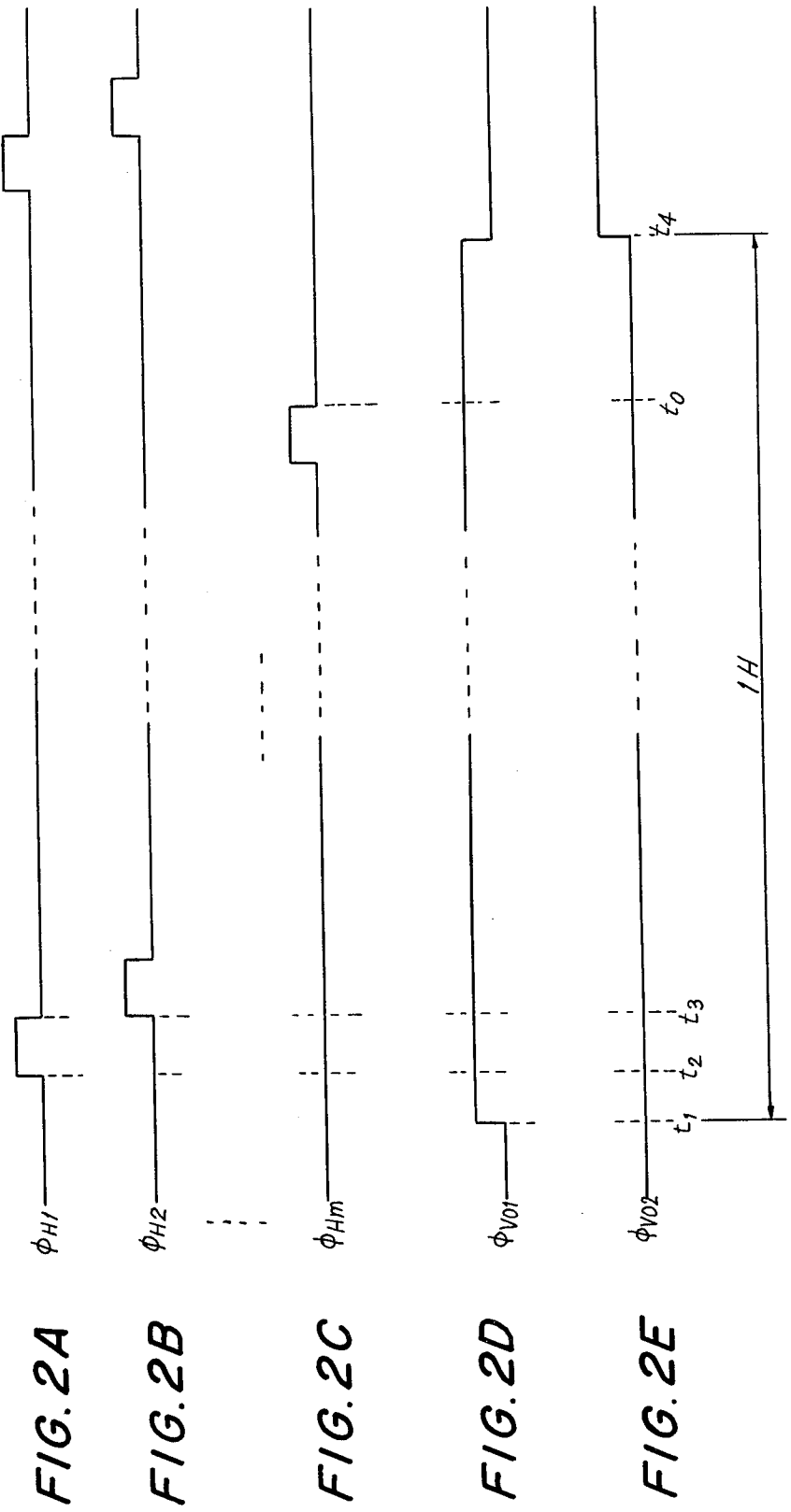

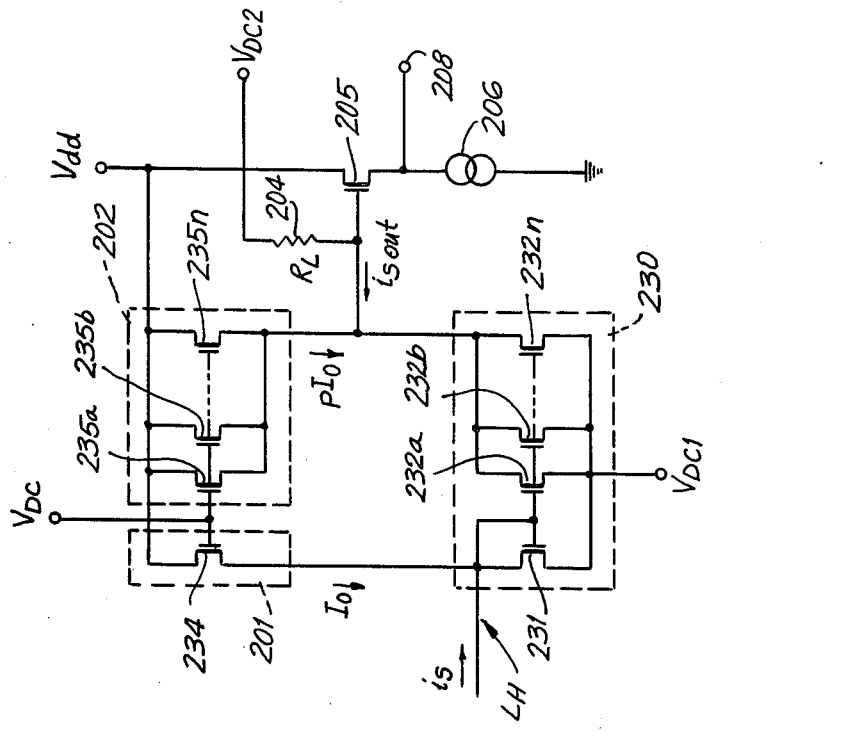
FIG. 13
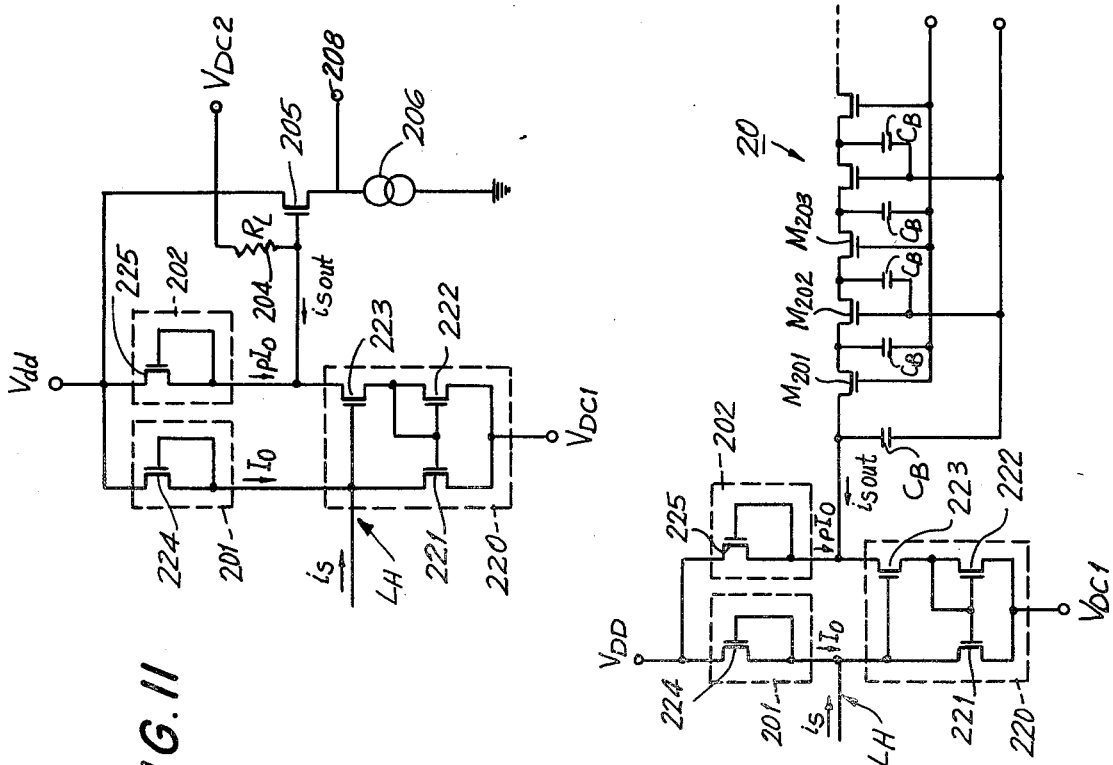
FIG. 11
FIG. 12

FIG.17A
FIG.17B
FIG.17C
FIG.17D
FIG.17E
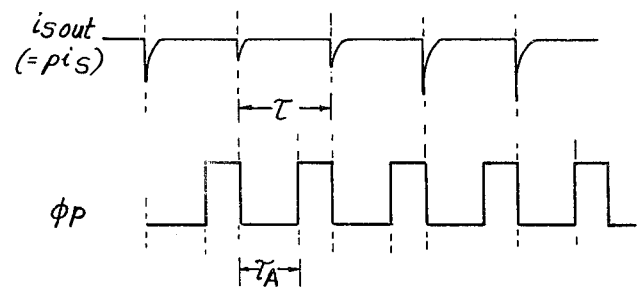
FIG.18
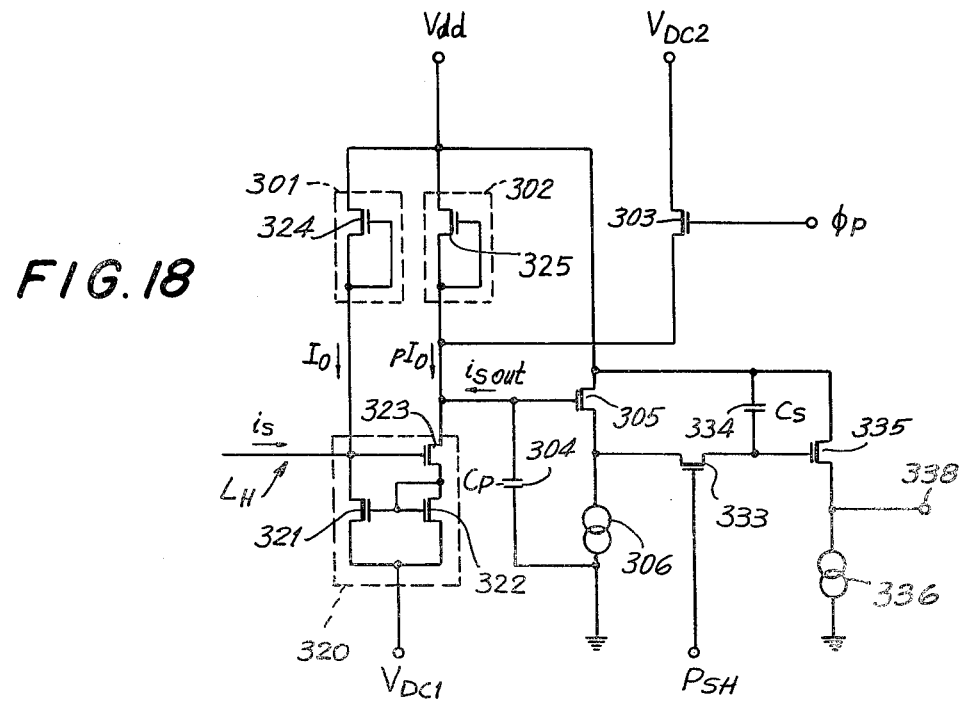

4,463,383

IMAGE PICKUP APPARATUS

BACKGROUND OF THE INVENTION

This invention relates to image pickup apparatus for providing a video signal, and is particularly directed to a solid-state image pickup device incorporating a current amplifier for converting a relatively feeble video signal to a strong video output signal with a high signal-to-noise (S/N) ratio.

A solid-state image pickup element, such as an MOS imager, generally provides a quite weak signal which must be amplified before being applied to a successive stage. This weak video signal is particularly susceptible to noise due to stray currents, shot noise, and the like. In an MOS imager, the video signal is provided as a diffentiated current. This signal must be integrated to obtain an average value, but integration lowers the overall level of the video signal. Thus, the integrated signal has a rather low S/N ratio.

An external amplifier is conventionally provided to amplify the output signal and thereby convert it to a level suitable for further processing. Unfortunately, this external amplifier amplifies the noise along with the video signal, and because it is external, also adds noise. Consequently, the resulting video output signal has a further deteriorated S/N ratio.

OBJECTS AND SUMMARY OF THE INVENTION

It is an object of this invention to provide video image pickup apparatus providing a strong video signal with a high signal-to-noise ratio.

It is another object of the invention to provide a video image pickup apparatus incorporating a current amplifier therein to avoid the aforementioned problems that occur when an external amplifier is used to amplify the video signal.

According to an aspect of this invention, image pickup apparatus are provided in which there are a plurality picture element units, each formed of a photo-sensitive member generating a quantum of electrical charge depending on the amount of light falling thereon and an electrically controlled gating circuit for transmitting the generated amount of charge in response to scanning pulses applied thereto, with the picture element units being disposed in a two-dimensional array of horizontal rows and vertical columns. Scanning signal generators sequentially provide horizontal and vertical scanning pulses to the gating circuits of the respective picture element units, so that the electrical charges are presented, in row-by-row sequence, to an output circuit to produce a video signal. In embodiments of this invention, the output circuit includes a current mirror circuit formed of first and second transistors, each having first and second current-carrying electrodes and a control electrode, with the first current-carrying electrodes thereof being coupled together to a source of reference potential and with the control electrodes being connected to one another. A current source is coupled to the second current-carrying electrode of the first transistor, and an output load device is coupled between the second current-carrying electrode of the second transistor and another source of reference potential. The video signal is applied to the second current-carrying electrode of the first transistor of the current mirror circuit, and an output video signal is derived at the second current-carrying electrode of the second transistor thereof.

Preferably, the gating circuits of the picture element units and the transistors of the current mirror circuit are all formed on the same integrated circuit chip, as are the current source and load device of the current mirror circuit, so that unwanted noise is not introduced into the video output signal.

In several embodiments, the first and second transistors are MOS (metal-oxide-semiconductor) transistors, and the current gain of the current mirror circuit is appropriately adjusted by selecting the gate lengths and gate widths of these transistors. In many embodiments, the output load device can include a serial charge transfer circuit, such as a CCD (charge-coupled device) or BBD (bucket-brigade device), having an input coupled to the second current-carrying electrode of the second transistor. In that case a current source also provides a constant current to the second transistor.

In other embodiments, the load device can include a load capacitor having one plate coupled to the second current-carrying electrode of the second transistor and another plate coupled to a reference point, and a pre-charging transistor for charging the one plate of the load transistor during occurrences of a switching pulse.

The above and many other objects, features, and advantages of this invention will become apparent from the ensuing description of several preferred embodiments thereof, which is to be considered in connection with the accompanying drawings.

BRIEF DESCRIPTION OF THE DRAWINGS

FIGS. 2A to 2E are waveform charts of scanning pulse signals used in conjunction with the image sensor of FIG. 1.

FIGS. 11 to 15 are schematic diagrams of pertinent portions of seventh to eleventh embodiments of this invention, respectively.

FIGS. 17A to 17E are waveform diagrams for explaining operation of the twelfth embodiment of this invention.

FIGS. 18 to 20 are schematic diagrams of pertinent portions of thirteenth, fourteenth, and fifteenth embodiments of this invention, respectively.

DETAILED DESCRIPTION OF SEVERAL PREFERRED EMBODIMENTS

Figure 1:
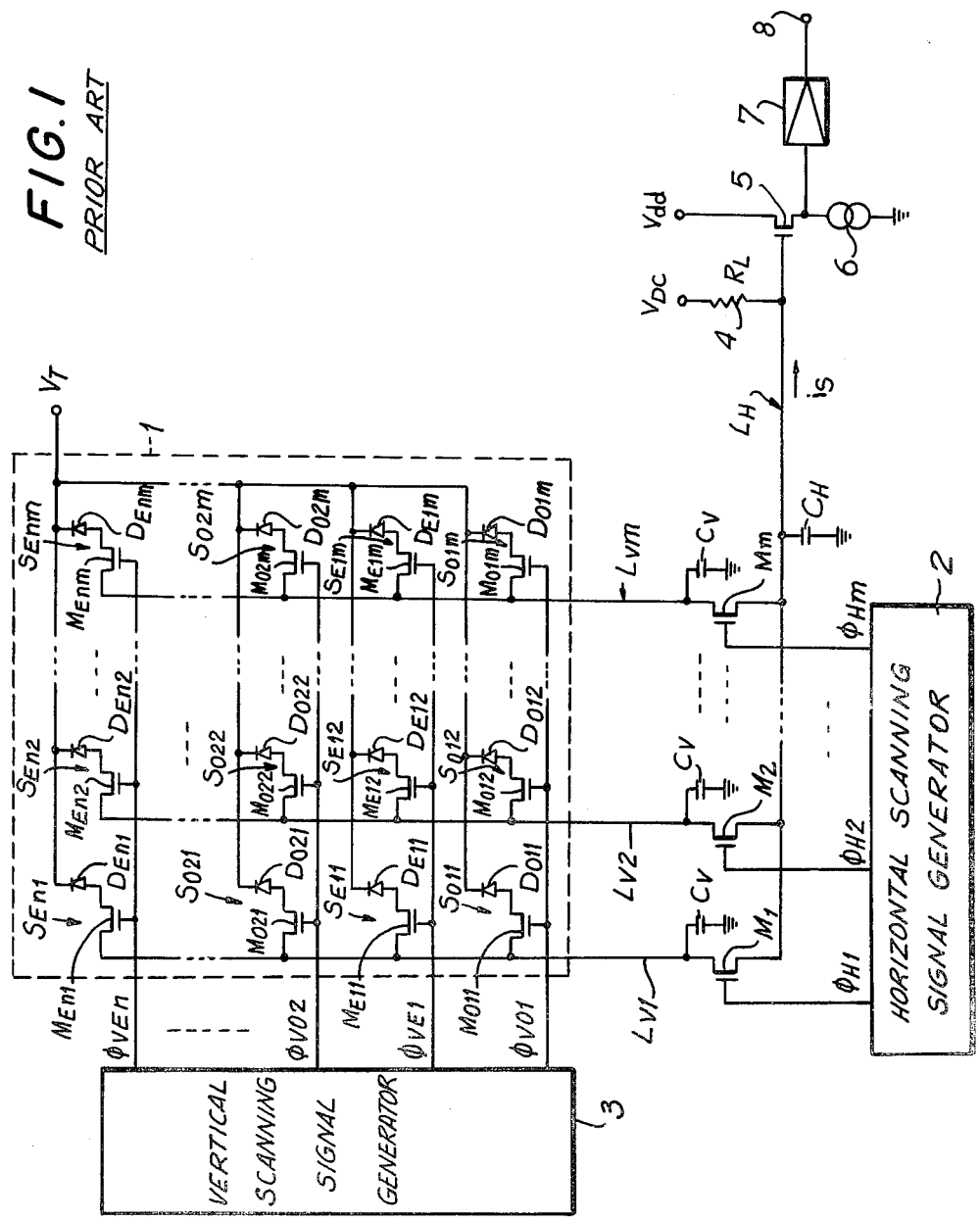
FIG. 1 is a schematic diagram of a conventional solid-state image sensor.

Initially, for purposes of background and to emphasize the advantages of this invention, a conventional solid-state image sensor will be described with reference to FIG. 1.

In this conventional image sensor, an MOS (Metal-Oxide-Semiconductor) imager 1 is constituted by a plurality of picture element units $S_{011}$ to $S_{Enm}$ disposed in a two-dimensional, or X-Y array formed of m horizontal rows by n vertical columns.

A horizontal scanning circuit 2 provides successive horizontal gating pulses $\phi_{H1}$ (FIG. 2A), $\phi_{H2}$ (FIG. 2B), . . . to $\phi_{Hm}$ (FIG. 2C) to the picture element units of each horizontal row in turn. At the same time, a vertical scanning circuit 3 provides interlaced odd and even vertical gating pulses $\phi_{V01}$ (FIG. 2D), $\phi_{V02}$ (FIG. 2E) . . . . $\phi_{VE1}$, $\phi_{VE2}$, . . . . $\phi_{VEn}$. The interlacing of the vertical gating pulses corresponds to the interlacing of a television image, in which a field of odd lines and a field of even lines alternate.

In this image sensor, each of the m picture element units $S_{011}$, $S_{012}$, . . . . $S_{01m}$ for the first odd line are disposed in line in the horizontal direction, and the picture element units for the remaining lines are similarly disposed.

Each of the picture element units $S_{011}$, $S_{012}$, . . , $S_{01m}$, . . . $S_{Enm}$ is formed of a photo diode $D_{011}$, $D_{012}$ . . , $D_{01m}$, . . . $D_{Enm}$, which can be a PN or PIN type, and an associated MOS gating transistor $M_{011}$, $M_{012}$, . . . , $M_{01m}$, . . . $M_{Enm}$. The photodiodes have their cathodes connected in common to a target voltage source $V_T$ and have their anodes coupled to the source electrode of the associated MOS gating transistors $M_{011}$, $M_{012}$, . . . . $M_{01m}$, $ME_{nm}$ The drain electrodes of these transistors are connected to respective vertical transmitting lines $L_{V1}$, $L_{V2}$, . . . $L_{Vm}$, for each vertical column (i.e., for each successive horizontal position) while the gate electrodes of the MOS gating transistors of each partricular horizontal row are connected in common to an output of the vertical scanning circuit 3 to receive a particular scanning pulse $\phi_{V01}$, $\phi_{V02}$ . . . . $\phi_{VEn}$ in accordance with the particular image line to be scanned. For example, the scanning signal $\phi_{V01}$ of FIG. 2D is furnished to the gate terminals of the transistors $M_{011}$ to $M_{01m}$ of the first odd horizontal row during a first horizontal scanning period.

The remaining odd lines and all of the even lines of the picture element units $S_{011}$, $S_{012}$ . . . . $S_{01m}$, . . . $S_{Enm}$ are constituted in like manner.

Consequently, an odd field of video is generated in response to feeding of odd vertical scanning pulses $\phi_{V01}$, $\phi_{V02}$ . . . to the gate electrodes of the transistors $M_{011}$, $M_{012}$, . . . . $M_{01m}$; $M_{021}$, $M_{022}$ . . . $M_{02m}$ in the sequential odd horizontal rows, and an even field of video is generated in response to feeding of even vertical scanning pulses $\phi_{VE1}$, $\phi_{VE2}$ . . . . $\phi_{VEn}$ to the gate electrodes of the transistors $M_{E11}$, $M_{E12}$ . . . . $M_{E1M}$ . . . $M_{Enm}$ of the sequential even rows.

Each vertical transmitting line $L_{V1}$, $L_{V2}$, . . . $L_{Vm}$ has associated with it a capacitance $C_V$ for storing the electric charge passed by the gating transistors $M_{011}M_{011}$ . . . . $M_{01m}$ . . . . $M_{Enm}$ in response to each particular vertical scanning pulse $\phi_{V01}$ to $\phi_{VEn}$, so that the capacitances $C_V$ at any line interval hold the electrical charge generated in one particular horizontal row of picture element units $S_{011}$ to $S_{01m}$, . . . . , $S_{En1}$ to $S_{Enm}$.

Each of the vertical transmitting lines $L_{V1}$ to $L_{Vm}$ also includes a respective MOS transistor $M_1$, $M_2$, . . . $M_m$ having a source electrode coupled to the associated capacitance $C_V$, and having a gate electrode coupled to a respective output of the horizontal scanning circuit 2 to receive a particular horizontal scanning pulse $\phi_{H1}$, $\phi_{H2}$, . . . . $\phi_{Hm}$. The drain electrodes of the MOS transistors $M_1$ to $M_m$ are connected in common to a horizontal output transmitting line $L_H$. A capacitance $C_H$ is associated with the horizontal transmission line $L_H$, while a load resistor 4 of a value $R_L$ bridges between a DC voltage source $V_{DC}$ and the horizontal transmitting line $L_H$.

Here, the capacitances $C_H$ and $C_V$ are shown as lumped values, but in practice they are substantially distributed over the respective transmitting lines $L_H$ and $L_{V1}$ to $L_{Vn}$.

The horizontal output transmitting line $L_H$ is also coupled to a gate electrode of an output MOS transistor 5 connected as a source follower and serving as an isolation stage, with its drain electrode connected to a drain potential $V_{dd}$ and its source electrode connected to voltage source 6 and also to a pre-amplifier 7 to amplify the video signal and provide the same to an output terminal 8.

In this MOS imager 1, light incident on each diode $D_{011}$ to $D_{Enm}$ of each picture element unit $S_{011}$ to $S_{Enm}$ causes the diodes to generate electron-hole pairs. Consequently, a signal charge $Q_S$ is stored between the gate and source electrodes of each respective MOS gating transistor $M_{011}$ to $M_{Enm}$ The size of each signal charge $Q_S$ depends on the strength of the light incident on the particular diode $D_{011}$ to $D_{Enm}$.

Occurance of the vertical scanning signals $\phi_{V01}$, $\phi_{V02}$, . . . $\phi_{VEn}$ places, at a high level, all of the gate electrodes of the gating transistors $M_{011}$ to $M_{01m}$; $M_{021}$ to $M_{02m}$; . . . ; $M_{Em1}$ to $M_{Enm}$ for one particular horizontal row. As a result, all of the signal charges $Q_S$ for the picture element units $S_{011}$ to $S_{01m}$; $S_{021}$ to $S_{02m}$; . . . $S_{En1}$ to $S_{Enm}$ of that particular row are gated to the capacitances $C_V$ for the respective vertical transmission lines $L_{V1}$ to $L_{Vm}$.

As shown in FIGS. 2A to 2C, the horizontal scanning pulses $\phi_{H1}$ to $\phi_{Hm}$ go from low to high levels at times $t_2$, $t_3$ . . . . $t_0$ and return to their low levels so as not to overlap one another. However, each such scanning pulse $\phi_{H1}$ to $\phi_{Hm}$ is of a sufficient length to transfer the charge $Q_S$ from each capacitance $C_V$ to the capacitance C.H As shown in FIGS. 2D and 2E, the vertical scanning pulse $\phi_{V01}$ is high from a time $t_1$ until a later time $t_4$, at which time the next vertical scanning pulse $\phi_{V02}$ becomes high. In fact, all of the vertical scanning pulses $\phi_{V01}$ to $\phi_{VEn}$ are provided in a non-overlapping fashion.

If it is assumed that the pulse width of each horizontal scanning pulse $\phi_{H1}$ to $\phi_{Hm}$ is $\tau$, the time $t_2$ that the first scanning signal $\phi_{H1}$ is made high occurs a predetermined time after the time $t_1$ or $t_4$ following the onset of each vertical scanning pulse $\phi_{V01}$ to $\phi_{VEn}$.

As aforementioned, each transmitting line $L_H$ and $L_{V1}$ to $L_{Vn}$ has a respective capacitance $C_H$ and $C_V$; the load resistor 4 has a resistance value $R_L$. The signal charge $Q_S$ stored in each picture element unit $S_{011}$ to $SE_{nm}$ generates a signal current $i_S$ to flow whenever the associated horizontal and vertical scanning pulses are high. For the charge $Q_{S011}$ of the picture element $S_{011}$, these pulses are both high from the times $t_2$ to $t_3$ (FIG. 2A). Thus, the signal current $i_S$ associated with this particular picture element unit $S_{011}$ can be expressed $$i_S = \frac{Q_{SO11}}{R_L(C_V + C_H)} \cdot \exp\left(-\frac{t}{R_L(C_V + C_H)}\right) \quad (1)$$

The resulting output voltage $V_{out}$ at the input to the preamplifier 7 becomes $$V_{out} = \frac{Q_{SO11}}{C_V + C_H} \cdot \exp\left(-\frac{t}{R_L(C_V + C_H)}\right) \quad (2)$$

Here, it is important that the time constant $R_L(C_V+C_H)$ be sufficiently small that all of the charge $Q_S$ is transferred during each on period $(\tau = t_2 - t_1)$ of the horizontal scanning pulses $\phi_{H1}$ to $\phi_{Hn}$. That is, for a value k defined by the equation $$R_L(C_V+C_H) = \tau/k \quad (3)$$

be rather larger than unity, for example K=5.

The same requirement holds true for all the picture element units $S_{O11}$ to $S_{Emn}$. For example, for the signal charge $Q_{SO12}$ of the picture element $S_{O12}$, the output voltage $V_{out}$ becomes $$V_{out} = \frac{Q_{SO12}}{C_V + C_H} \cdot \exp\left(-\frac{t}{R_L(C_V + C_H)}\right) \quad (4)$$

Thus, as each unit $S_{O11}$ to $S_{Onm}$ and $S_{E11}$ to $S_{Enm}$ is sequentially scanned, its respective signal charge $Q_{SO11}$ to $Q_{SEnm}$ and $Q_{SE11}$ to $Q_{SEnm}$ flows through its associated vertical signal transmitting line $L_{V1}$ to $L_{Vm}$, and then through the horizontal transmitting line $L_H$ and the load resistor 4 as a signal current $i_S$, which is used to derive the video signal as the output voltage $V_{out}$.

However, it is clear from equations (2) and (4) above that the output voltage $V_{out}$ is a differential voltage, and cannot, with satisfactory results, be used directly as a stable input for a sample-hold or peak-hold circuit. Therefore, it is generally necessary to produce an average, or mean value of the output voltage $V_{out}$ by use of an integrator or low-pass filter. This results in an average output voltage $]V_{out}[_{mean}$ as expressed $$[V_{out}]_{mean} = \frac{Q_S}{C_V + C_H} \cdot \frac{1}{\tau} \int_0^\tau \exp\left(\frac{t}{R_L(C_V + C_H)}\right) dt \quad (5)$$

$$= \frac{Q_{S1}}{C_V + C_H} \cdot R_L(C_V + C_H) \cdot$$

$$\left[\exp\left(-\frac{t}{R_L(C_V + C_H)}\right)\right]_\tau^0 \cdot \frac{1}{\tau}$$

$$= \frac{Q_S \cdot R_L}{\tau}(1 - e^{-k})$$

Here, k is set at K≧5 as was true in equation (3) so that the factor $e^{-k}$ can be disregarded. If the signal charge $Q_S$ is thought of as being the product of the signal voltage $V_S$ times the gate-to-source storage capacitance $C_O$ of a particular picture element unit S, and the discharge time thereof is represented by the expression $k R_L(C_V+C_H)$ from equation (3), then the average output voltage $]V_{out}[_{mean}$ becomes $$[V_{out}]_{mean} = \frac{C_O \cdot R_L \cdot v_S}{k \cdot R_L(C_V + C_H)} \quad (6)$$

$$= \frac{C_O}{k(C_V + C_H)} \cdot v_S$$

As k is large compared to unity, and the capacitance $C_O$ is small compared to the capacitances $C_V$ and $C_H$, it becomes readily apparent from equation (6) that the mean value $[V_{out}]_{mean}$ is extremely low. Therefore, the preamplifier 7 is required to have both a high gain and a high S/N ratio, and, consequently, is quite expensive.

Further, in a usual MOS imager, the circuit elements from the light-receiving portion 1 to the source-follower transistor 5 are integrated onto a single IC chip, and the preamplifier 7 is an external device connected to the transistor 5. Outside noise, such as clock noise, is likely to be introduced at the input of the preamplifier 7. Also, because the average value signal $[V_{out}]_{mean}$ is so small, it is easily affected by outside noise, and the S/N ratio suffers greatly.

One possible approach to improving the signal strength of the output signal $[V_{out}]_{mean}$ has been to make the value k small (k≈1), i.e., correspondingly to increase the value $R_L$ of the load resistor 4. However, if the resistor 4 is too large, the complete signal charge $Q_S$ for each picture element unit S will not be entirely transmitted during a single horizontal scanning pulse period $\tau$, and there is noticeable deterioration in both horizontal and vertical resolution.

Figure 3:
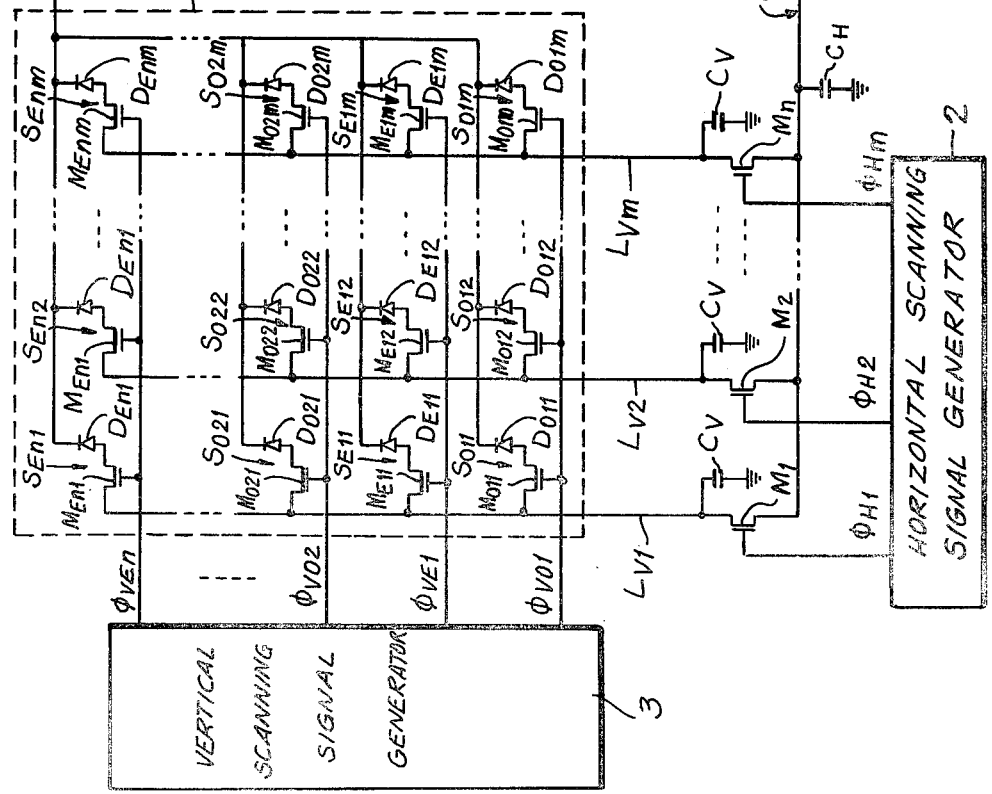
FIG. 3 is a diagram of a first embodiment of the improved image sensor according to the present invention.

A first embodiment of this invention is shown in FIG. 3, wherein elements common to the circuit of FIG. 1 are identified with the same reference characters, and a detailed description thereof is omitted.

Here, instead of the load resistor 4, the source follower 5, and the preamplifier 7, the horizontal signal transmitting line $L_H$ ends in a current-mirror current amplifying circuit 100.

This circuit 100 includes a current source 101 coupled between a source of drain voltage $V_{dd}$ and an input terminal of a current mirror circuit 102. A load resistor 104 of value $R_L$ is coupled between the source of voltage $V_{dd}$ and an output of the current mirror circuit 102, the latter being connected also to the gate electrode of a source follower transistor 105 which is driven by a voltage source 106 and whose source electrode is connected to an output terminal 108.

The current mirror circuit 102 is formed of first and second MOS transistors 111 and 112 whose source electrodes are connected together to a voltage reference point $V_{DC1}$, and whose gate electrodes are connected together. The gate electrodes thereof are also connected to the drain electrode of the first MOS transistor 111, which then serves as the input electrode for the current mirror circuit and is connected to the horizontal signal transmitting line $L_H$ and to the current source 101. The drain electrode of the second MOS transistor 112 serves as the output electrode for the current mirror circuit and is connected to the load resistor 104 and the gate electrode of the source follower transistor 105.

In the current mirror circuit 102, and output current flowing through the resistor 104 and the drain electrode of the second MOS transistor 112 will be equal to (or alternatively, proportional to) the input current flowing through the first MOS transistor 111. The current mirror circuit 102 has a current gain p, which is a fixed parameter related to the characteristics of the transistors 111 and 112. The constant current source 101 provides a constant drain current $I_O$, and the signal current $i_S$ is also applied to the input electrode of the current mirror circuit 102. Thus, an output signal current $i_{sout}$ appears at the output electrode of the current mirror circuit (i.e., at the drain of the second MOS transistor 102:

$$i_{sout} = p \cdot (i_S + I_O) \tag{7}$$

Here, if the first MOS transistor 111 has a transconductance $g_m$, that transistor can be considered to have a corresponding resistance $R_{11}$ being the inverse thereof, i.e. $1/g_m$. In such case, the signal current is of equation (1) can be expressed $$i_S = \frac{Q_S}{R_{11}(C_V + C_H)} \cdot \exp\left(-\frac{t}{R_{11}(C_V + C_H)}\right) \tag{8}$$

By selecting the time constant $R_{11}(C_V + C_H)$ of equation (8) sufficiently small relative to the time used for scanning a single picture element unit $S_{OII}$ to $S_{Enm}$, substantially the entire signal charge $Q_S$ for each such unit will be discharged through the horizontal signal transmitting line $L_H$ and the first MOS transistor 111 to the voltage reference point $V_{DC1}$. Consequently, in a relation similar to that of equation (3) a value $k'$, defined as $$k' = \frac{\tau}{R_{11}(C_V + C_H)} \tag{9}$$

can be set significantly larger than unity, for example $k' \geq 3$ to 5.

The output signal of the current mirror circuit is a differentiated waveform corresponding to the previously-mentioned output current $i_{sout}$, and can be suitably passed through a low pass filter or differentiator, yielding an average-value voltage $[V_{out}]_{mean}$:

$$\begin{aligned}[V_{out}]_{mean} &= \int_0^T [i_{sout}]_{AC} \cdot R_L dt \cdot \frac{1}{\tau} \\ &= R_L \cdot p \cdot \int_0^T i_S dt \cdot \frac{1}{\tau} \\ &= \frac{R_L \cdot Q_S}{\tau} \cdot p \end{aligned} \tag{10}$$

In other words, the average-value output signal voltage is p times as large as the corresponding voltage in the circuit of FIG. 1 (equation (5)).

Figure 4:
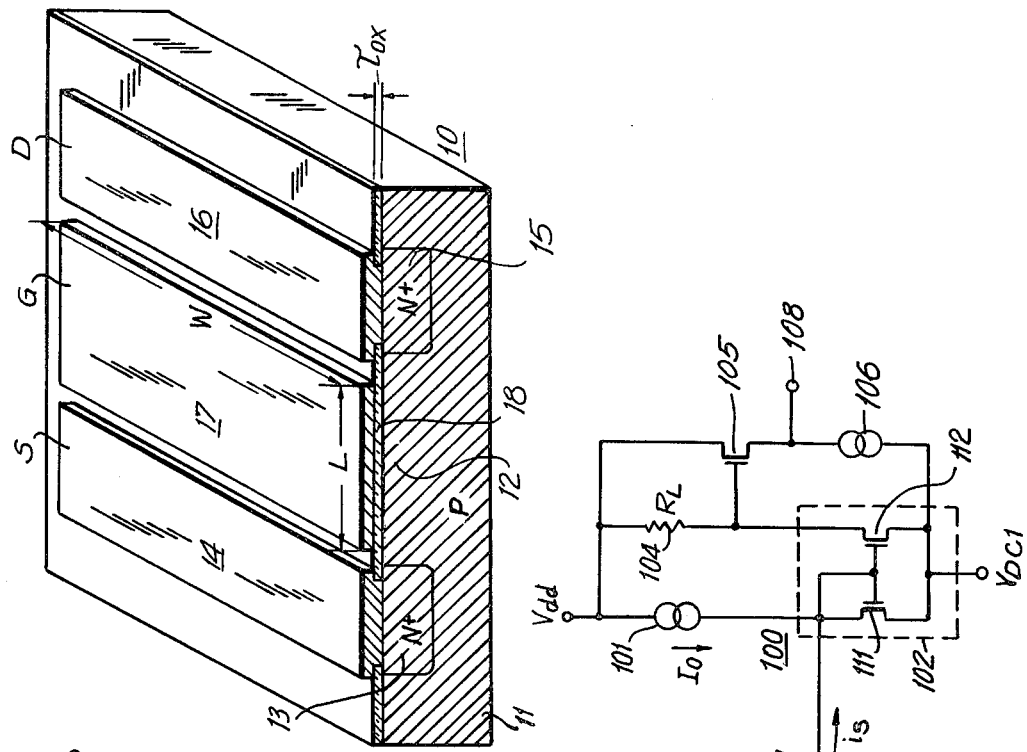
FIG. 4 is a perspective illustrative view of an MOS transistor which can be used in the first embodiment of this invention.

Further, the current gain p can be established by selecting gate lengths and gate widths for the transistors 111 and 112. This can be better understood from a consideration of the structure of a typical MOS transistor, illustrated in FIG. 4.

A typical MOS field effect transistor 10 is formed on a semiconductor substrate 11 with a gate plateau 12 extending from a highly doped source region to which an aluminum source electrode 14 is connected, to a highly doped drain region 15 to which an aluminum drain electrode 16 is connected. A gate electrode 17 formed of deposited aluminum is separated from the gate plateau 12 by an oxide layer 18. This layer 18 has a thickness $t_{ox}$ which is a constant, and which is substantially the same for all MOS transistors formed on the same substrate 11. The gate plateau region 12 has a carrier mobility $\mu_n$ which is also a constant for all such transistors formed on the same substrate 11. The gate plateau 12 has a length L between the source region 13 and the drain region 15, and has a width W in the direction perpendicular to the length L. The oxide layer 18 also has a dielectric constant $\epsilon_{ox}$.

Thus, the FET transistor 10 has an intrinsic gain factor $\beta$ which can be expressed as follows:

$$\beta = \frac{\mu_N \epsilon_{OX}}{2t_{ox}} \cdot \frac{W}{L} \tag{11A}$$

In the current-mirror circuit 102 of FIG. 3, the effective resistance $R_{11}$, as expressed in equations (8) and (9) is substantially determined by the relationship $$R_{11} = \frac{1}{2\sqrt{\beta I_O}} \tag{11B}$$

As is apparent from equation (11B), the value of the constant current $I_O$ can be selected so that the value $k'$ in the above equation (9) is sufficiently greater than unity.

Also, it should be apparant that the gain p of the current mirror circuit 102 can be appropriately determined by selection of the gate length $L_1$ and gate width $W_1$ of the first MOS transistor 111 and by correspondingly selecting the gate length $L_2$ and the gate width $W_2$ of the second MOS transistor 112 according to the following relationship $$p = \frac{(W_2/L_2)}{(W_1/L_1)} \tag{11C}$$

From equation (11C) it follows that equation (10) can be modified so that the average value of the output voltage $[v_{out}]_{mean}$ can be simply expressed $$[V_{out}]_{mean} = \frac{R_L Q_S}{\tau} \cdot \frac{(W_2/L_2)}{(W_1/L_1)} \tag{12}$$

It is well understood by those versed in circuit integration that, in light of the foregoing, the gain of the current mirror circuit 102, and consequently, the level of the average value output voltage $[v_{out}[_{mean}$ can be set at a desired level simply by selecting the surface dimensions of the gate plateau 12 for the respective MOS transistors 111 and 112.

As described hereinabove with reference to this first embodiment of the invention, the value of the relevant time constant for transfering the signal charges $Q_s$ depends on the resistance value $R_{11}$, which is the inverse of the conductance $g_m$ of the first MOS transistor 111, as represented in equation (9). Consequently, the value $R_L$ of the load resistor 104 can be made independent of any restrictions on this relevant time constant, and a large output signal, having an improved S/N ratio can easily be derived. In other words, the resistance value $R_{11}$ can be made quite small simply by selecting the value of the constant current $I_O$ so that the signal charge $Q_s$ will be reliably transmitted, and vertical and horizontal resolution will be improved.

Figure 5:
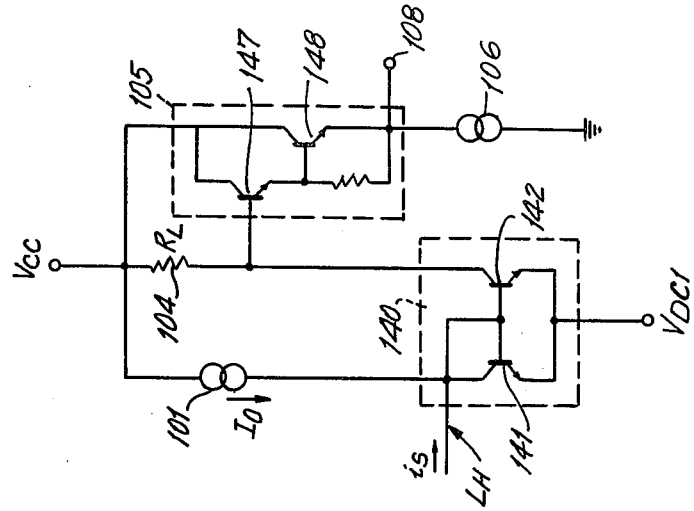
FIGS. 5-7 are schematic diagrams of a portion of the improved image sensor according to second, third, and fourth embodiments thereof, respectively.

A second embodiment of this invention is shown in pertinent part in FIG. 5. Here, a feed-forward current mirror circuit 120 is formed of three MOS transistors 121, 122, and 123, while the constant current source 101 is formed of a P-channel FET 125 and a source 126 of bias voltage $V_1$.

In this embodiment, the MOS transistors 121 and 122 each have their source electrodes connected together to a voltage source $V_{DC1}$ and their gate electrodes connected together to the drain electrode of the transistor 122. The remaining MOS transistor 123 has its gate electrode connected to the drain electrode of the transistor 121, at which the signal current is and the constant current $I_O$ are applied. The transistor 123 has its source electrode connected to the drain electrode of the transistor 122 and has its drain electrode connected to the load resistor 104 and to the gate electrode of the source follower 105.

This feed-forward current mirror circuit 120 achieves a high gain and is useful in connection with a high resolution imager.

The P-channel FET 125 has its source electrode connected to the DC voltage source $V_{dd}$ and has its drain connected to the input electrode of the current mirror circuit 120 (i.e., to the drain of the MOS transistor 121). The voltage source 126 supplies the bias voltage $V_1$ between the source and gate electrodes of the transistor 125 so that the constant current $I_0$ is determined by the following relationship $$I_0 = \beta(V_1 - V_{th})^2 \tag{13}$$

where is the gain factor of equation (11A) above. Thus, the bias voltage $V_1$ is selected so that the constant current $I_0$ has the desired value.

Figure 6:
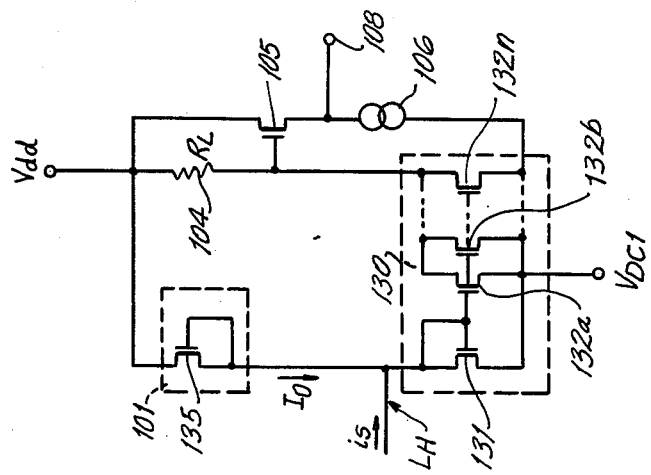

FIG. 6 illustrates pertinent portions of a third embodiment of this invention wherein a current mirror circuit 130 thereof uses a single input MOS transistor 131 and a plurality of output MOS transistors 132a, 132b, ... 132n connected in parallel to decrease the current amplification factor thereof. Here, the constant current source 101 includes a depletion-type field effect transistor 135 with its gate electrode joined to its source electrode, the latter providing the constant current $I_0$ which is applied to the drain of the MOS transistor 131.

In this third embodiment, if the gate length of the input MOS transistor 131 is $L_1$ and its gate width is $W_1$, and the corresponding gate lengths of the output transistors 132a, 132b, and 132n are $L_a, L_b, \ldots L_n$ with the corresponding gate widths being $W_a, W_b, \ldots, W_n$, respectively, the average value output signal $[v_{out}]_{mean}$ can be expressed as follows:

$$[V_{out}]_{mean} = \frac{R_L Q_S}{\tau} \cdot \frac{(W_a/L_a) + (W_b/L_b) + \ldots + (W_n/L_n)}{(W_1/L_1)} \tag{14}$$

Figure 7:
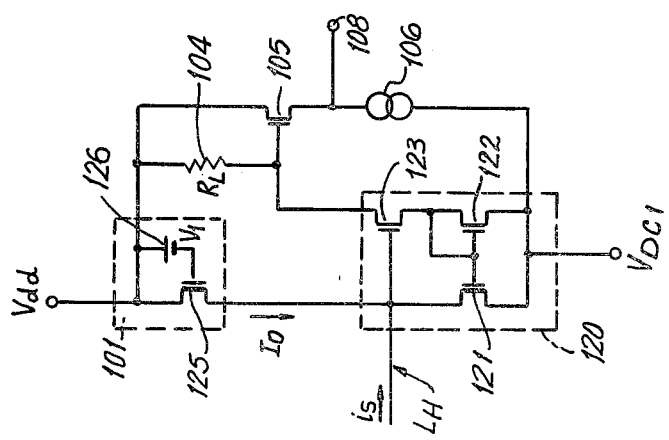

As evidenced by a fourth embodiment, illustrated in part in FIG. 7, the apparatus of this invention can comprise a current mirror circuit 140 formed of bipolar junction transistors. In this embodiment, NPN junction transistors 141 and 142 generally replace the MOS transistors 111 and 112 of the first embodiment and the constant current source 101 supplies a constant current $I_0$ to the collector of the transistor 141. Also, a collector voltage $V_{cc}$ replaces the drain voltage $V_{dd}$ of the earlier embodiments.

Also in this fourth embodiment, a Darlington arrangement of NPN transistors 147 and 148 replaces the MOS transistor used as the source follower 105 in the previous embodiments.

In this embodiment, if the junction transistors 141 and 142 have respective emitter areas of $A_1$ and $A_2$, the average value of the output voltage $[v_{out}]_{mean}$ can be expressed $$[V_{out}]_{mean} = \frac{R_L Q_S}{\tau} \cdot \frac{A_2}{A_1} \tag{15}$$

Figure 8:
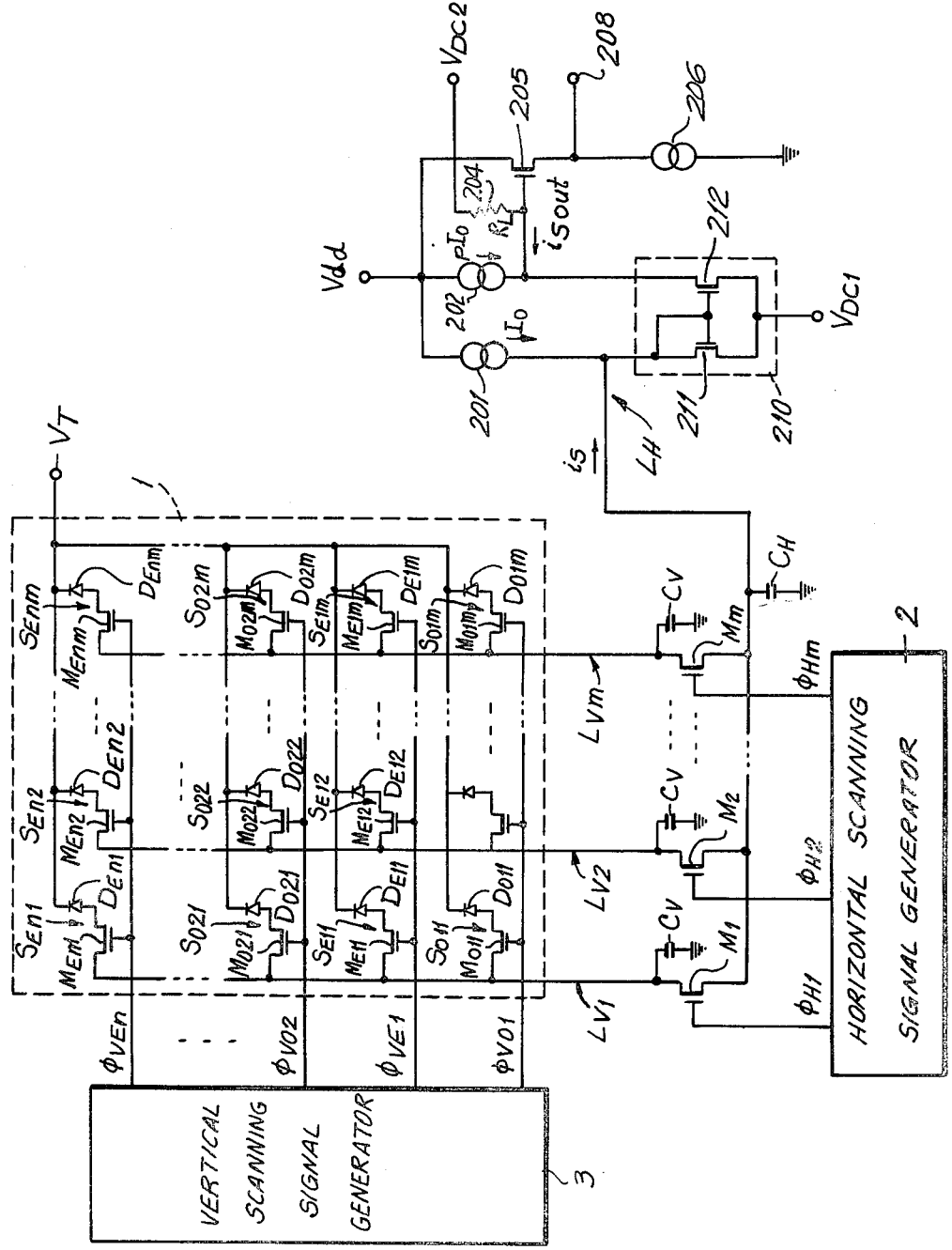
FIG. 8 is a schematic diagram of a fifth embodiment of this invention.

A fifth embodiment of this invention is illustrated in FIG. 8, in which elements in common with previous embodiments are identified with the same reference characters, and a detailed description thereof is omitted.

A feature differentiating this embodiment from the previous embodiment, is that a second DC constant current $pI_O$ is provided to compensate for the constant current $I_O$. That is, in this embodiment, while a first constant current source 201 provides the constant current $I_O$ to the drain of a first MOS transistor 211 of a current mirror circuit 210, a second current source 202 provides the constant current $pI_O$ to the drain of a second transistor 212 of the current mirror circuit 210. The drain of the transistor 212 is coupled through a load resistor 204 of value $R_L$ to a DC voltage point $V_{DC2}$ and also to the gate electrode of a transistor 205 connected as a source follower with its source electrode coupled to a current source 206 and also to an output terminal 208.

In this fifth embodiment, if the current gain p of the current mirror circuit 210, as determined by the respective gate widths $W_1$ and $W_2$ and gate lengths $L_1$ and $L_2$ of the transistors 211 and 212 in accordance with equation (7) above, the ratio of the constant current $pI_O$ to the constant current $I_O$ will be the same as the current gain of the current mirror circuit 210.

As a result, the current flowing through the source and drain of the MOS transistor 212 is p $(i_s + I_O)$ as is set fourth in the above-mentioned equation (7). Therefore the output current $i_{sout}$ flowing through the load resistor 204 can be expressed $$i_{sout} + pI_O = p(I_O + i_s) \tag{16}$$

$$i_{sout} = pi_s$$

$$= \frac{(W_2/L_2)}{(W_1/L_1)} \cdot i_s$$

In this case, the output current $i_{sout}$ has only AC signal components, but these are amplified by a factor of p with respect to the input current $i_s$. This output current $i_{sout}$ is then converted to a voltage through the output resistor 204, and the output voltage $R_L \cdot i_{sout}$ is processed through the source follower transistor 205 and is presented at the output 208.

This output current $i_{sout}$ has a differential waveform corresponding to that of the input signal $i_s$. Therefore, the output voltage $v_{out}$ has an inverted differential waveform, which must normally be processed through a low-pass filter or integrator (not shown) to obtain the average-value output voltage $[v_{out}]_{mean}$ of equation (10) above. Accordingly, the gate lengths and gate widths of the MOS transistors 211 and 212 can be selected so that the output voltage $v_{out}$ has a suitable amplitude for successful integration.

The discharging time constant $\tau_D$ of the MOS imager 1 of this embodiment can be expressed in terms of the resistance $R_{11}$, which is the inverse of the transconductance $g_m$ of the MOS transistor 211.

$$\tau_D = (C_V + C_H) \cdot R_{11} \tag{17}$$

Here, the resistance $R_{11}$ has exactly the same form as in the equation (11) above. In consequence, this fifth embodiment provides the advantages of the first to fourth embodiments. In addition, because only AC components flow through the load resistor 204, the voltage $V_{DC2}$ does not need to be closely regulated.

Also, in this fifth embodiment, it is a simple matter to construct the current sources 201 and 202 to provide their respective constant current $I_O$ and $pI_O$ while being connected to the same drain voltage source $V_{dd}$. In addition, because there is no DC current flowing through the resistor 204, thermal noise is reduced, and the S/N ratio is improved.

In many image pickup devices, it is useful to connect a charge transfer device (CTD) such as a charge coupled device (CCD) or a bucket brigade device (BBD) to the image pickup apparatus for futher processing of the video signal. However, if a sampled video signal is provided directly from an imager, such as that of FIG. 1, to an input stage of a CTD, not only will the S/N ratio deteriorate, but there will also be a significant loss in resolution. In addition, amplifying stages necessary to couple the circuit of FIG. 1 to a CTD can make the system to become large and expensive, and can increase the current consumption significantly.

However, the current mirror circuit arrangement incorporated in the present invention facilitates coupling of a CTD to the image pickup apparatus.

Figure 9:
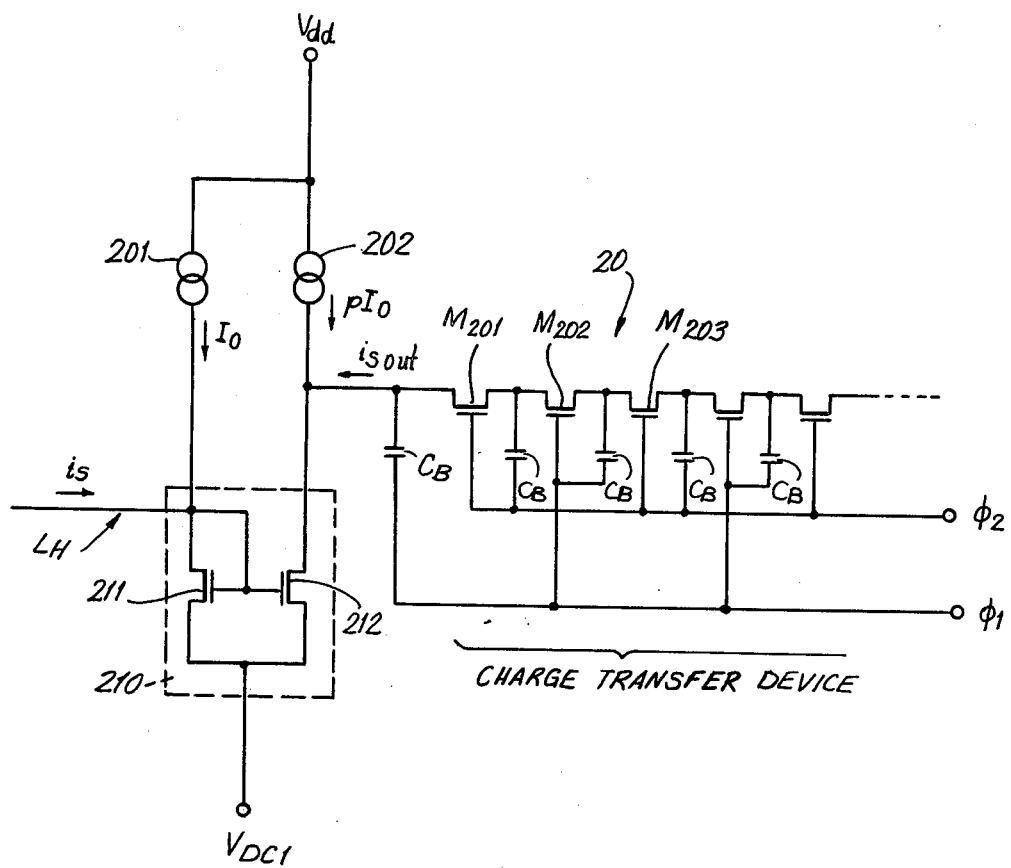
FIG. 9 is a schematic diagram of a pertinent portion of a sixth embodiment of this invention.

The coupling of a charge transfer device to the image pickup apparatus of this invention is illustrated by a sixth embodiment as shown in FIG. 8. In this embodiment, elements in common with the embodiment of FIG. 9 are identified with the same characteristic.

In this embodiment, a serial charge transfer device 20, which can be a bucket brigade device, acts as an output load, and has an input connected to the source electrode of the second transistor 212 of the current mirror circuit 210. The charge transfer device 20 comprises a series of MOS transistors $M_{201}$, $M_{202}$, $M_{203}$, etc. with successive ones thereof joined gate-electrode-to-source-electrode. The gate electrodes of alternate ones of these transistors $M_{202}$, etc. are coupled to receive a first phased clock signal $\phi_1$, while the gate electrodes of the remaining transistors $M_{201}$, $M_{203}$, etc. are coupled to receive a second phased clock signal $\phi_2$. An input capacitor of value $C_B$ is connected to an input electrode of the first transistor $M_{201}$ and receives the output current $i_{sout}$ as a charging current. A plurality of transfer capacitors, each of which has a capacitance of $C_B$ are respectively coupled between gate electrode of an associated transistor and the junction of that transistor with the next in sequence.

The signal voltage $v_{out}$ appearing at the input of the charge transfer device 20 is expressed $$V_{out} = \frac{1}{C_B} \int_O^T i_{sout} \, dt \qquad (18)$$
$$= \frac{pQ_s}{C_B}$$

The relation of the voltage $V_1$ at the input of the charge transfer device 20 to the voltage $V_2$ at the junction of the transistors $M_{201}$ and $M_{202}$ can be explained with reference to FIGS. 10A to 10G.

Figure 10A:
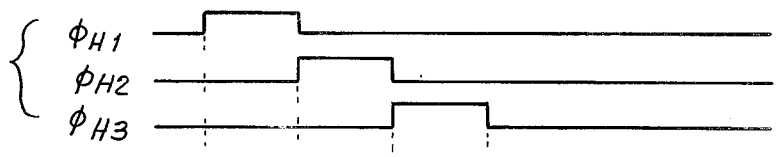
FIGS. 10A to 10G are waveform charts for explaining operation of the sixth embodiment.
Figure 10B:
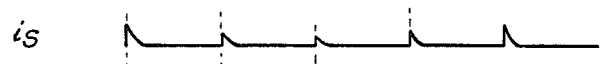
Figure 10C:
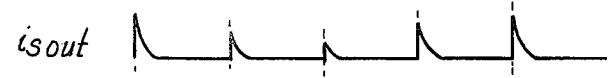
Figure 10D:
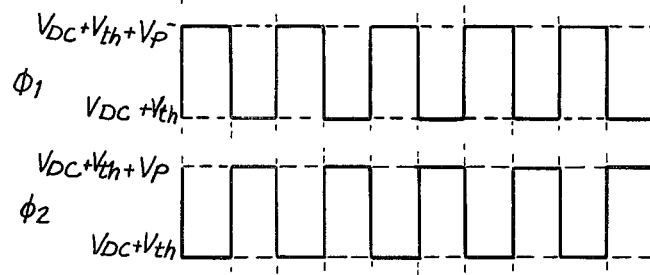
Figure 10E:
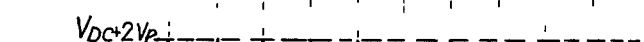
Figure 10F:
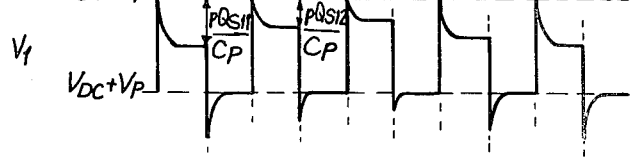
Figure 10G:
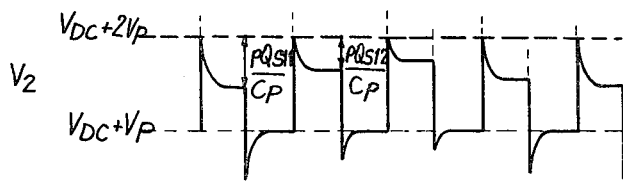

As explained previously in response to the horizontal scanning pulses $\phi_{H1}$, $\phi_{H2}$, $\phi_{H3}$, etc. (FIG. 10A) a differential signal current $i_s$ (FIG. 10B) flows in the horizontal signal transmitting line $L_H$, and a corresponding amplified output current $i_{sout}$ is (FIG. 10C) is provided at the drain terminal of the MOS transistor 212. The two phased clock signals $\phi_1$ and $\phi_2$, shown in FIGS. 10D and 10E, respectively, alternate between a low and high voltages. Here, the period of the phased clock signals $\phi_1$ and $\phi_2$ are equal to the width of the horizontal scanning pulses shown in FIG. 10A. As shown in FIG. 10F, the voltage $V_1$ at the input of the first transistor $M_{201}$ settles to a voltage $pQ_{s11}/C_B$ in accordance with equation (18). The alternating phased clock pulses $\phi_1$ and $\phi_2$ cause the signal charges to march to the right in the drawing so that the voltage $V_2$ at the junction of the transistor $M_{201}$ with the next transistor $M_{201}$ has the same value as the voltage $V_1$, but delayed by a period of one half clock cycle, as shown in FIG. 10G. Thus, the signal voltage $v_{out}$ as determined by the signal current $i_{sout}$ is transferred sequentially by the serial charge transfer device 20 so that suitable signal processing can be carried out.

This sixth embodiment has the same advantages of the fifth embodiment mentioned previously, and in addition, because the charge transfer device 20 is coupled directly to the current mirror circuit 210, it is possible to omit stages for amplification after voltage conversion, for carrying out a sample-hold function, or for integrating.

Many possible variations of the foregoing embodiments are possible without departing from the principles of this invention.

One such variation is exemplified by a seventh embodiment, favorably shown in FIG. 11. In this embodiment, a feed-forward type current mirror circuit 220 is utilized, whose construction is similar to the current mirror circuit 120 of the second embodiment. In addition, depletion type field effect transistors 224 and 225 are used as constant current sources 201 and 202. In this embodiment, the currents $I_O$ and $pI_O$ flowing through the depletion type field effect transistor 224 and 225 can be expressed according to the relationships $$I_O = \beta_{224} V_{th}^2$$

and $$pI_O = \beta_{225} V_{th}^2 \qquad (19)$$

where $\beta_{224}$ and $\beta_{225}$ are gain factors, as expressed in equation (11) above, for the respective depletion-type field effect transistors 224 and 225, and $V_{th}$ is the threshold voltage therefor.

FIG. 12 shows an eighth embodiment of this invention, wherein the current mirror circuit 220 of the above embodiment has an output tied directly to a serial charge transfer device 20 of the type shown in FIG. 9.

FIG. 13 shows a ninth embodiment of this invention, employing the principles of the third and fifth embodiments hereof. In this embodiment, a current mirror circuit 230 employs one input MOS transistor 231 and a plurality of output MOS transistors 232a, 232b, ... 232n, connected in parallel in an output current path.

The associated constant current source 201 employs a single MOS transistor 234 to supply the constant current $I_O$ to the drain electrode of the transistor 231, while the second constant current source 202 employs a plurality of MOS transistors 235a, 235b, ... 235n, coupled in parallel to provide the constant current $pI_O$ to the transistors 232a, 232b, . . . 232n. In this embodiment N-channel MOS transistors are used as the transistors 231, 232a, 232b, . . . , and 232n, of the current mirror circuit 232, while P-channel MOS transistors are used for the transistors 234, 235a, 235b, . . . , and 235n. The gate electrodes of the transistors 234, 235a, 235b, . . ., 235n are coupled in common to a DC voltage source $V_{DC}$.

In this ninth embodiment, the average value of the output signal $[v_{out}]$ mean obtained at the output terminal 208 is expressed $$[V_{out}]_{mean} = \frac{R_L Q_s(W_{2a}/L_{2a}) + (W_{2b}/L_{2b}) + \ldots + (W_{2n}/L_{2n})}{(W_1/L_1)} \quad (20)$$

where $W_1, W_{2a}, W_{2b}, \ldots W_{2n}$ are the gate widths, and $L_1, L_{2a}, L_{2b}, \ldots L_{2n}$ are the gate lengths of the transistors 231, 232a, 232b, . . . and 232n, respectively. If the transistors 234, 235a, 235b, . . . 235n, have respective gate widths of $W_4, W_{5a}, W_{5b}, \ldots W_{5n}$, and gate lengths of $L_4, L_{5a}, L_{5b}, \ldots L_{5n}$, the output signal current $i_{sout}$ will be free of any DC component, i.e., will contain only AC components, and will be equal to p $i_s$ if each of the above gate lengths and widths is selected to satisfy the following relationship:

$$p = \frac{(W_{2a}/L_{2a}) + (W_{2b}/L_{2b}) + \ldots + (W_{2n}/L_{2n})}{(W_1/L_1)} \quad (21)$$

$$= \frac{(W_{5a}/L_{5a}) + (W_{5b}/L_{5b}) + \ldots + (W_{5n}/L_{5n})}{(W_4/L_4)}$$

In this ninth embodiment, a charge transfer device can be coupled directly to the output terminal of the current mirror circuit 230, i.e., to the joined-together drain terminals of the transistors 232a to 232n.

Figure 14:
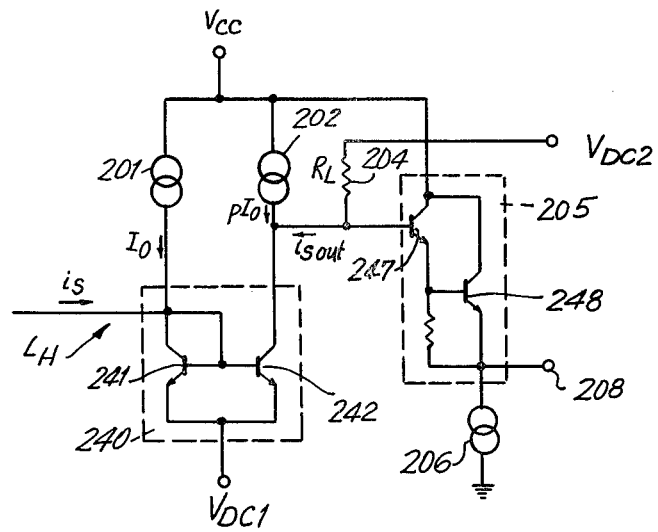

FIG. 14 illustrates a tenth embodiment, wherein a current mirror circuit 240 employing junction transistors 241 and 242, and also employing a Darlington arrangement of bipolar junction transistor 247 and 248, are used in lieu of MOS transistor based circuits 230, 205 in FIG. 8.

Figure 15:
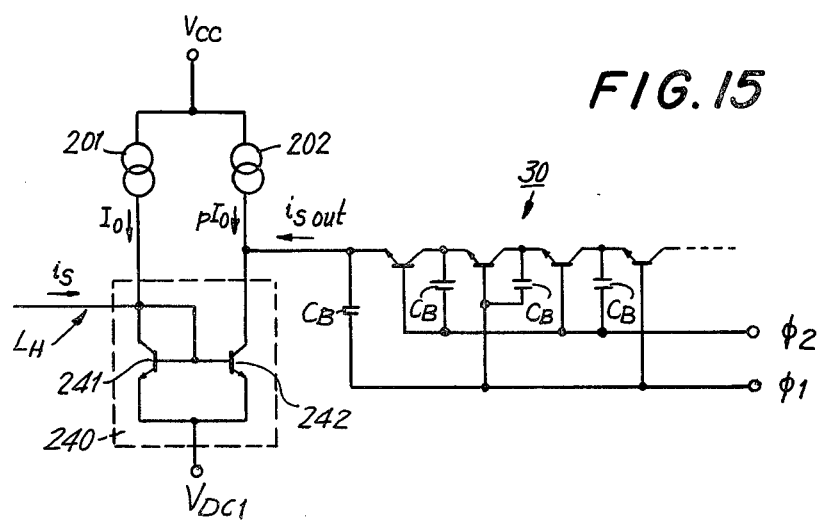

FIG. 15 shows an eleventh embodiment, which is similar in form to the sixth embodiment (FIG. 9) but which employs a current mirror circuit 240 formed of bipolar junction transistors 241 and 242. In this embodiment, a bipolar charge transfer device 30 has its input connected directly to the collector of the output transistor 242.

Figure 16:
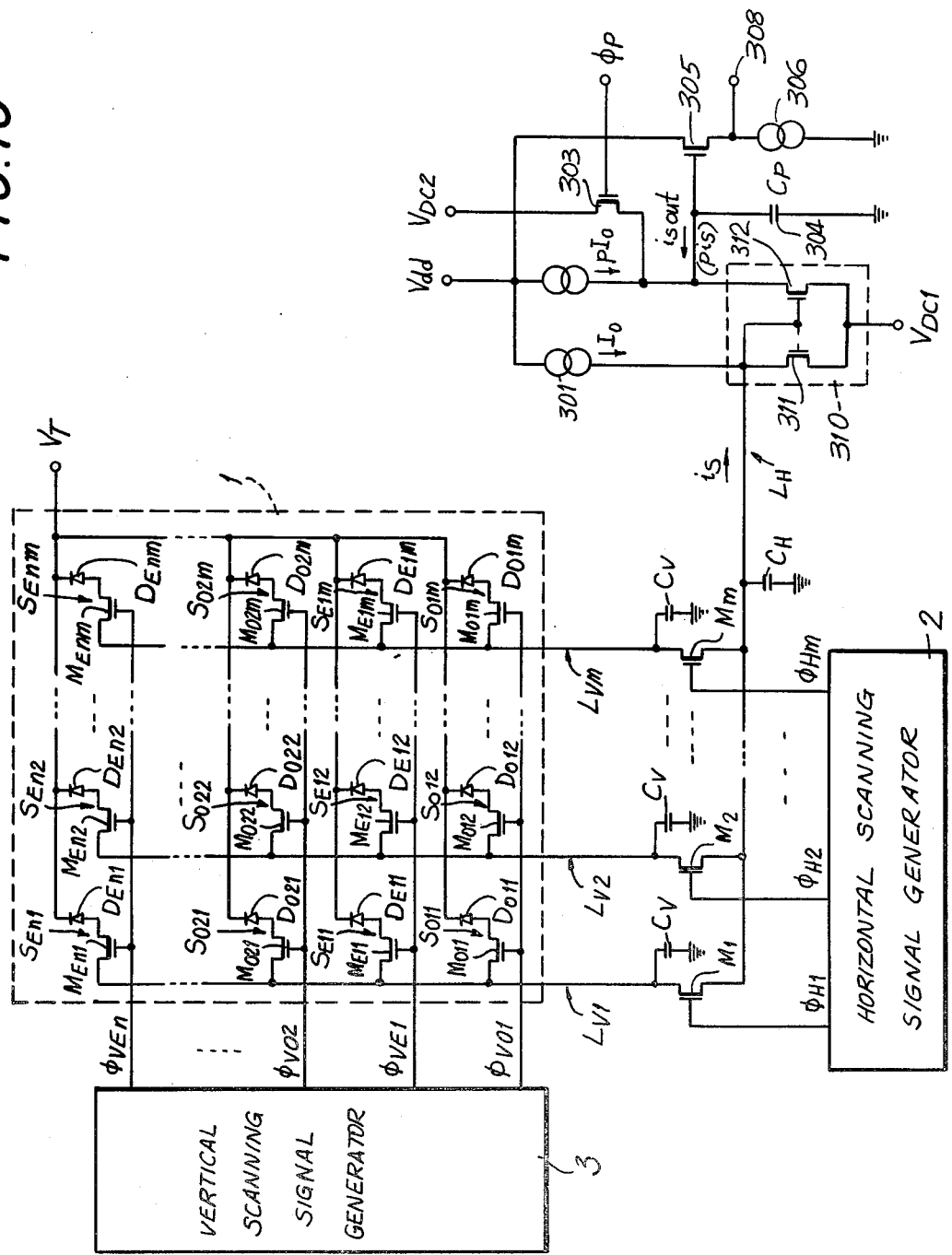
FIG. 16 is a schematic diagram of an improved image sensor according to a twelfth embodiment thereof.

A twelfth embodiment of this invention is shown in FIG. 16, in which elements in common with the previously-described embodiments are identified with the same reference characters. In this embodiment, a current mirror circuit 310 is formed of MOS transistors 311 and 312, and has associated current sources 301 and 302. This current mirror circuit 310 is arranged generally similar to the circuit of FIG. 8. However, in this embodiment, the output load is formed of a pre-charging MOS field effect transistor 303 and a load capacitor 304. The latter has one plate coupled to the drain electrode of the transistor 312, and has its other plate coupled to ground. The pre-charging transistor 303 has a drain electrode connected to a source of DC voltage $V_{DC2}$ and has its source electrode connected to the one plate of the load capacitor 304. A clock pulse signal $\phi p$ is applied to the gate electrode of the transistor 303. If the load capacitor 304 has a capacitance of $C_p$, the signal voltage $v_{out}$ appearing at the one plate of the load capacitor 304 is determined by the relationship $$V_{out} = \frac{1}{C_p} \int_0^{T_A} i_{sout} dt \quad (22)$$

$$= \frac{pQ_s}{C_p}$$

where $T_A$ is the pre-charging ON time of the transistor 304, as governed by the clock signal $\phi_p$.

An isolation stage, formed of a source-follower transistor 305 and a current source 306 couples the load capacitor 304 to an output terminal 308.

In this embodiment, even though the signal current $i_s$ is positive, as shown in FIG. 17A, the output signal current $i_{sout}$ (FIG. 17B) is negative, in that it represents a discharging of the load capacitor 304. Thus, it is required to pre-charge the load capacitor 304 to a constant initial value, such as the voltage $V_{DC2}$. For this reason the clock pulse signal $\phi_p$ (FIG. 17C) is supplied to the gate electrode of the transistor 303 to drive the transistor 303 on for a brief period immediately before the output signal current $i_{sout}$ flows. Consequently, the capacitor is charged up before being partially discharged by the output signal current $i_{sout}$. Thus, the load capacitor 304 has an output waveform $V_{out}$ as shown in FIG. 17D.

Because the output waveform $V_{out}$ is generally stable at a point just prior to the rising of the clock pulse signal $\phi_p$, a sample hold operation can be carried out at the times indicated by vertical arrows in FIG. 17E, to produce the sampled and held voltage shown in FIG. 17E.

As the signal charge $Q_s$ of any of the picture elements $S_{011}$ to $S_{Emn}$ is represented by $$Q_s = C_o v_s \quad (23)$$

then the output voltage $v_{out}$ in the above equation (22) becomes $$V_{out} = p \cdot C_o / C_p \cdot v_s \quad (24)$$

From equation (24), it is apparent that the current amplification factor p of the current mirror circuit 310 can be increased, and the capacitance value $C_p$ of the load capacitor 304 can be decreased, so that an extremely large signal output voltage can be obtained at the output terminal 308.

A thirteenth embodiment of this invention is illustrated in FIG. 18. In this embodiment, which combines features of the twelfth embodiment with those of the eighth embodiment, a feed-forward current mirror circuit 320 employs constant current sources 301 and 302 each utilizing a depletion-type field effect transistor 324 and 325, respectively. The current mirror circuit 320 employs first, second, and third MOS transistors 321, 322, and 323 coupled in the same manner as the corresponding transistors in the second and eighth embodiments.

In addition, this embodiment also comprises a sample hold circuit connected to the output of the source follower transistor 305. A sample pulse $P_{sh}$, such as that indicated by the arrows in FIG. 17E, is applied to the gate electrode of a sample gate transistor 333. The latter has an input electrode coupled to the output of the source follower transistor 305, and a holding capacitor 334, of capacitance $C_s$, is coupled between an output electrode of the sampling gate transistor 333 and a point of reference potential, such as the source voltage $V_{dd}$. An isolation stage, such as a source-follower transistor 335 coupled to a current source 336 has an input connected to the capacitor 334 and an output connected to an output terminal 338.

With an arrangment similar to that shown in FIG. 18, a sample hold operation can be easily performed, and the sample and held signal of FIG. 17E can be easily obtained at the output terminal 338.

Figure 19:
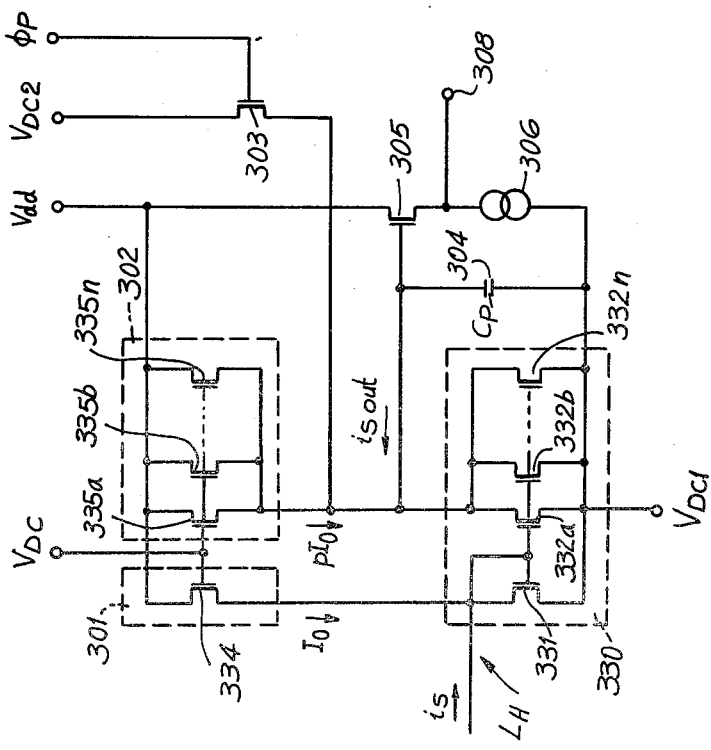

FIG. 19 shows a fourteenth embodiment of this invention, which combines features of the ninth embodiment and the twelfth embodiment. Here, a current mirror circuit 330 is formed of a plurality of MOS transistors 331, 332a, 332b, . . . 332n. Similarly, a constant current source 301 is formed of a single MOS transistor 334, while the current source 302 is formed of a plurality of MOS transistors 335a, 335b, . . . , 335n. If the transistors 331 and 334 has a gate lengths of $L_1$ and $L_4$, respectively, and gate widths of $W_1$ and $W_4$, respectively, while the transistors 332a to 332n, and 335b to 335n, have gate lengths of $L_{2a}$ to $L_{2n}$ and $L_{5a}$ to $L_{5n}$, respectively, and gate widths of $W_{2a}$ to $W_{2n}$, and $W_{5a}$ to $W_{5n}$, respectively, the average value of the output signal voltage $[v_{out}]_{mean}$ in this embodiment can be expressed $$[V_{out}]_{mean} = \frac{Q_s}{C_p} \cdot \frac{(W_{2a}/L_{2a}) + (W_{2b}/L_{2b}) + \ldots + (W_{2n}/L_{2n})}{(W_1/L_1)} \quad (25)$$

The conditions necessary for cancellation of DC current in the output signal $i_{sout}$ will be satisfied if the following conditions are met $$p = \frac{(W_{2a}/L_{2a}) + (W_{2b}/L_{2b}) + \ldots + (W_{2n}/L_{2n})}{(W_1/L_1)} \quad (26)$$

$$= \frac{(W_{5a}/L_{5a}) + (W_{5b}/L_{5b}) + \ldots + (W_{5n}/L_{5n})}{(W_4/L_4)}$$

Figure 20:
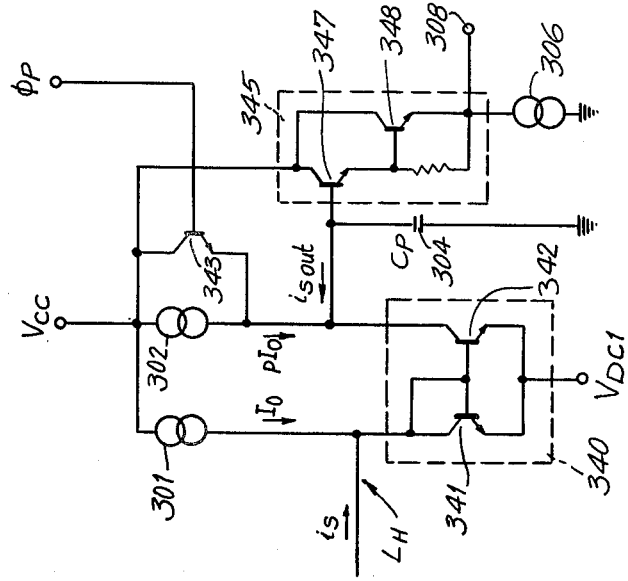

FIG. 20 shows a fifteenth embodiment of this invention, in which bipolar transistors are used in place of MOS transistors. While a description of the particular connections thereof is believed unnecessary, it will be mentioned that this embodiment employs a current mirror circuit formed of NPN transistors 341 and 342, a pre-charging NPN transistor 343 and an output isolation stage formed of a Darlington pair of NPN transistors 347 and 348.

Of course, many further variations are possible applying the principles of this invention. For example, PIN diodes can be used as a part of each of the picture element units $S_{011}$ to $S_{Emn}$ of the light-receiving portion of the imager 1. Also, P-chanel type and N-channel type elements can be replaced, respectively, by N-channel type and P-channel type elements. Also, while NPN bipolar transistors have been shown hereinabove, PNP junction transistors could be substituted, changing the voltage polarities as required.

While several embodiments of the present invention have been described in detail hereinabove, it should be apparent that many modifications and variations thereof will suggest themselves to those skilled in the art without departure from the scope and spirit of this invention, as defined in the appended claims.

What is claimed is:

1. Image pickup apparatus comprising a plurality of picture element units each formed of a photosensitive member generating a quantum of electrical charge depending on the amount of light falling thereon, and an electrically controlled gating circuit for transmitting the generated amount of charge in response to scanning pulses applied thereto, said picture element units being arranged in a two-dimensional array of horizontal rows and vertical columns; scanning circuit means for sequentially providing said scanning pulses to the gating circuits of the respective picture element units; and output circuit means coupled to receive the electrical charges in sequence, from said picture element units to produce an output video signal, wherein said output circuit means includes a current mirror circuit formed of first and second transistors each having first and second current-carrying electrodes and a control electrode, with the first current-carrying electrodes thereof being coupled together to a source of reference potential and with their control electrodes being connected to one another, a current source coupled to the second current-carrying electrode of said first transistor, and an output load coupled between said second current-carrying electrode of said second transistor and a second source of reference potential, with said generated electrical charge being applied to the second current-carrying electrode of said first transistor and said output video signal being provided at the second current-carrying electrode of said second transistor.

2. Image pickup apparatus according to claim 1, wherein said array picture element units is formed on a single integrated circuit chip and the first and second transistors, the current source and the output load device of said current mirror circuit are also all formed on said single integrated circuit chip.

3. Image pickup apparatus according to claim 1, wherein said load device includes a load resistor coupled between said second current carrying electrode of said second transistor and said second source of reference potential, with an isolation stage coupled to said second current carrying electrode of said second transistor to furnish said output video signal.

4. Image pickup apparatus according to claim 3, wherein said isolation stage includes a field effect transistor connected as a source follower.

5. Image pickup apparatus according to claim 3, wherein said first and second transistors are MOS field effect transistors both formed on a single semiconductor chip, each having as its control electrode a conductive gate electrode overlying a semiconductor gate region and separated therefrom by an insulator layer of predetermined constant thickness, the gate regions of said first and second transistors having respective gate widths $W_1$ and $W_2$ and respective gate lengths $L_1$ and $L_2$, with the current mirror circuit having a current gain p determined by construction of said gate widths and gate lengths to satisfy the relationship $$p = \frac{W_2/L_2}{W_1/L_1}.$$

6. Image pickup apparatus according to claim 5, wherein a third MOS field effect transistor has first and second current-carrying electrodes respectively coupled to said second current-carrying electrode of said second transistor and to said output load, and has a gate electrode coupled to the second current-carrying electrode of said first transistor, with the gate electrodes of said first and second transistors being coupled to the second current-carrying electrode of said second transistor.

7. Image pickup apparatus according to claim 6, wherein said current source includes a P-channel field effect transistor having a drain coupled to said first transistor, and a predetermined bias voltage applied between source and gate electrodes thereof.

8. Image pickup apparatus according to claim 6, wherein said current mirror circuit has a predetermined current gain p, and includes another current source coupled to the second current carrying electrode of said third transistor to provide a constant current thereto, the other and the first and second current sources providing currents in the ratio of the current gain p of said current mirror circuit.

9. Image pickup apparatus according to claim 8, wherein each of said first, second and said other current sources includes a depletion-type field effect transistor having a drain electrode connected to a source of drain voltage, a source electrode coupled to the second current-carrying electrode of a respective one of said first and third transistors, and a gate electrode coupled to the source electrode of the respective depletion-type field effect transistor.

10. Image pickup apparatus according to claim 3, wherein said current mirror circuit includes further transistor coupled in parallel to said second transistors each with a first and a second current-carrying electrode joined respectively to the first and second current carrying electrodes of the second transistor and with a control electrode joined to the control electrodes of said first and second transistors.

11. Image pickup apparatus according to claim 10, wherein said first, second, and further transistors are all MOS field effect transistors formed on a single semiconductor chip, each having a conductive gate electrode overlying a semiconductor gate region and separated therefrom by an insulator layer of predetermined constant thickness, the gate regions of the first, second, and each further transistors having respective gate widths of $W_1, W_a, W_b \ldots W_n$ and respective gate lengths of $L_1, L_a, L_b, \ldots L_n$, with the current mirror circuit having a current gain p determined by construction of said gate widths and gate lengths to satisfy the relationship $$p = \frac{(W_a/L_a) + (W_b/L_b) + \ldots + (W_n/L_n)}{W_1/L_1}.$$

12. Image pickup apparatus according to claim 11, wherein said current mirror circuit further includes another current source coupled to the joined-together second current carrying electrodes of said second and further transistors said other current source including a plurality of MOS field effect transistors having drains electrodes coupled together to a source of drain potential, gate electrodes coupled together to a DC control voltage, and source electrodes coupled together to said joined-together current-carrying electrodes.

13. Image pickup apparatus according to claim 12, wherein the MOS field effect transistors constituting said first, second, and further transistors are of one of an N-channel type and a P-channel type, and the MOS field effect transistors constituting said other current source are the other of said N-channel type and said P-channel type.

14. Image pickup apparatus according to claim 12, wherein said output load includes a load capacitor having one plate coupled to the second current-carrying electrode of said second transistor and another plate coupled to a reference point, and a pre-charging MOS field effect transistor having a first current-carrying electrode coupled to a voltage source, a control electrode connected to receive a switching pulse, and a second current-carrying electrode coupled to said one plate of said load capacitor.

15. Image pickup apparatus according to claim 1, wherein said first and second transistors are bipolar transistors with each having an emitter formed over a respective emitter area $A_1$ and $A_2$ thereon, and said current mirror circuit has a gain determined according to the relationship $$p = A_2/A_1.$$

16. Image pickup apparatus according to claim 15, wherein said output load includes a load capacitor having one plate coupled to the second current-carrying electrode of said second transistor and another plate coupled to a reference point, and a pre-charging junction transistor having a collector coupled to a voltage source, a base coupled to receive a switching pulse, and an emitter coupled to said one plate of said load capacitor.

17. Image pickup apparatus according to claim 15, wherein an isolation stage includes a pair of bipolar transistors coupled in a Darlington configuration with the pair having a power electrode coupled to a voltage source, a control electrode coupled to said second current-carrying electrode of said second transistor, and an output electrode; and a current source coupled between said output electrode and a reference point.

18. Image pickup apparatus according to claim 1, wherein said current mirror circuit has a predetermined current gain p and further includes another current source coupled to the second current-carrying electrode of said second transistor, with said other and the first-mentioned current sources providing respective constant currents whose ratio is substantially equal to the current gain of said current mirror circuit.

19. Image pickup apparatus according to claim 18, wherein said output load includes a serial charge transfer device having an input coupled to the second current-carrying electrode of said second transistor.

20. Image pickup apparatus according to claim 19, wherein said serial charge transfer device includes a plurality of transistors arranged with current carrying electrodes thereof coupled in series, with control electrodes of alternate ones being coupled to receive a first phased clock signal, and with control electrodes of the remaining ones being coupled to receive a second phased clock signal, an input capacitor coupled to a junction of a first current-carrying electrode of a first one of said plurality of transistors with the second current-carrying electrode of the second transistor of said current mirror circuit, and transfer capacitors respectively coupled between the control electrode of each transistor of said plurality of transistors and the junction of said each transistor and the next in sequence.

21. Image pickup apparatus according to claim 18, wherein said output load includes a load capacitor having one plate coupled to the second current-carrying electrode of said second transistor and another plate coupled to a reference point, and a pre-charging field effect transistor having a first current-carrying electrode coupled to a voltage source, a control electrode connected to receive a switching pulse, and a second current-carrying electrode coupled to said one plate of said load capacitor.

22. Image pickup apparatus according to claim 21, further comprising a sample-hold stage following said load capacitor.

23. Image pickup apparatus according to claim 22, wherein said sample-hold stage includes an isolation stage having an input coupled to said one plate of said load capacitor and an output; a sampling gate transistor having an input electrode coupled to the output of said isolation stage, a control electrode coupled to receive a sampling clock pulse, and an output electrode; and a holding capacitor coupled between the output electrode of said sampling gate transistor and a point of reference potential.

24. Image pickup apparatus according to claim 21, wherein said current mirror circuit includes a further transistor having first and second carrying electrodes coupled in series between said other current source and the second current carrying electrode of said second transistor, with the one plate of said load capacitor coupled to said second current-carrying electrode of said further transistor.

* * * * *